US012107595B2

(12) United States Patent
Yagishita

(10) Patent No.: US 12,107,595 B2
(45) Date of Patent: Oct. 1, 2024

(54) COMPARATOR AND ANALOG-TO-DIGITAL CONVERTER

(71) Applicant: SONY SEMICONDUCTOR SOLUTIONS CORPORATION, Kanagawa (JP)

(72) Inventor: Yuki Yagishita, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 104 days.

(21) Appl. No.: 17/906,663

(22) PCT Filed: Mar. 23, 2021

(86) PCT No.: PCT/JP2021/012087
§ 371 (c)(1),
(2) Date: Sep. 19, 2022

(87) PCT Pub. No.: WO2021/200416
PCT Pub. Date: Oct. 7, 2021

(65) Prior Publication Data
US 2023/0179220 A1 Jun. 8, 2023

(30) Foreign Application Priority Data
Mar. 30, 2020 (JP) ................................ 2020-061363

(51) Int. Cl.
*H03M 1/00* (2006.01)
*H03M 1/46* (2006.01)
(Continued)

(52) U.S. Cl.
CPC ............. *H03M 1/46* (2013.01); *H03M 1/662* (2013.01); *H03M 1/72* (2013.01)

(58) Field of Classification Search
CPC ............. H03M 1/46; H03M 1/62; H03M 1/72
(Continued)

(56) References Cited

U.S. PATENT DOCUMENTS 5,148,162 A * 9/1992 Crosby ................ H03K 5/2418
341/122
5,491,448 A * 2/1996 Naokawa .............. H03F 3/3067
330/264

FOREIGN PATENT DOCUMENTS

JP 2011-061337 A 3/2011

OTHER PUBLICATIONS

International Search Report and Written Opinion of PCT Application No. PCT/JP2021/012087, issued on Jun. 15, 2021, 08 pages of ISRWO.

(Continued)

*Primary Examiner* — Peguy Jean Pierre
(74) *Attorney, Agent, or Firm* — CHIP LAW GROUP

(57) ABSTRACT

A kickback current is suppressed so as not to generate a deviation in a signal that outputs a comparison result.
A comparator includes a first input terminal and a second input terminal to which a first differential input signal pair is input, a third input terminal and a fourth input terminal to which a second differential input signal pair is input, a first comparison circuit that outputs a signal corresponding to a difference signal of the first differential input signal pair generated by connecting the first input terminal to a positive side and connecting the second input terminal to a negative side and a difference signal of the second differential input signal pair generated by connecting the third input terminal to a positive side and connecting the fourth input terminal to a negative side, and a second comparison circuit that outputs a signal corresponding to a difference signal of the first differential input signal pair generated by connecting the first input terminal to a negative side and connecting the (Continued)

second input terminal to a positive side, and a difference signal of the second differential input signal pair generated by connecting the third input terminal to a positive side and connecting the fourth input terminal to a negative side.

15 Claims, 10 Drawing Sheets

(51) Int. Cl.
    *H03M 1/66*     (2006.01)
    *H03M 1/72*     (2006.01)

(58) Field of Classification Search
    USPC .......................................................... 341/126
    See application file for complete search history.

(56) References Cited

OTHER PUBLICATIONS

Shu, et al., "An Oversampling SAR ADC With DAC Mismatch Error Shaping Achieving 105 dB SFDR and 101 dB SNDR Over 1 KHz BW in 55 nm CMOS", IEEE, Journal of Solid-State Circuits, vol. 51, No. 12, Dec. 2016, pp. 2928-2940.

* cited by examiner

COMPARATOR AND ANALOG-TO-DIGITAL CONVERTER

CROSS REFERENCE TO RELATED APPLICATIONS

This application is a U.S. National Phase of International Patent Application No. PCT/JP2021/012087 filed on Mar. 23, 2021, which claims priority benefit of Japanese Patent Application No. JP 2020-061363 filed in the Japan Patent Office on Mar. 30, 2020. Each of the above-referenced applications is hereby incorporated herein by reference in its entirety.

TECHNICAL FIELD

The present disclosure relates to a comparator and an analog-to-digital converter.

BACKGROUND ART

A successive-approximation-register analog-to-digital converter (hereinafter, successive-approximation-register ADC) including a sampling switch, a comparator to which two differential input signal pairs are input, and a digital-to-analog converter (hereinafter, DAC) is known (see Non-Patent Document 1). This type of comparator holds a signal corresponding to a difference signal of one differential input signal pair and a difference signal of the other differential input signal pair. The DAC is controlled by the signal held by the comparator, and two differential input signal pairs are generated on the basis of the output signal of the DAC.

CITATION LIST

Non-Patent Document

Non-Patent Document 1: "An Oversampling SAR ADC With DAC Mismatch Error Shaping Achieving 105 dB SFDR and 101 dB SNDR Over 1 kHz BW in 55 nm CMOS" (IEEE Journal of Solid-State Circuit, 2016)

SUMMARY OF THE INVENTION

Problems to be Solved by the Invention

However, when the signal level of the difference signal of these differential input signal pairs greatly changes, a current (hereinafter, referred to as a kickback current) flows, under the effect of the changes, through the gate of the transistor to which the differential input signal pair is input. As a result, there is a possibility that the signal level of the difference signal fluctuates. When the signal level of the difference signal fluctuates, a deviation is generated in the output signal of the comparator, and the ADC does not operate normally.

Therefore, the present disclosure provides a comparator and an analog-to-digital converter that suppress the kickback current described above so as not to generate a deviation in a signal outputting a comparison result.

Solutions to Problems

In order to solve the problem described above, according to the present disclosure, there is provided a comparator including:

a first input terminal and a second input terminal to which a first differential input signal pair is input;

a third input terminal and a fourth input terminal to which a second differential input signal pair is input;

a first comparison circuit configured to output a signal corresponding to a difference signal of the first differential input signal pair generated by connecting the first input terminal to a positive side and connecting the second input terminal to a negative side and a difference signal of the second differential input signal pair generated by connecting the third input terminal to a positive side and connecting the fourth input terminal to a negative side; and a second comparison circuit configured to output a signal corresponding to a difference signal of the first differential input signal pair generated by connecting the first input terminal to a negative side and connecting the second input terminal to a positive side, and a difference signal of the second differential input signal pair generated by connecting the third input terminal to a positive side and connecting the fourth input terminal to a negative side.

A first output terminal and a second output terminal configured to output a differential output signal pair corresponding to the signal output from the first comparison circuit may further be included.

The difference signal of the first differential input signal pair may have a voltage level larger than a voltage level of the difference signal of the second differential input signal pair.

The first comparison circuit and the second comparison circuit may have a common circuit configuration and common electrical characteristics.

The first comparison circuit may include a first output node and a second output node configured to differentially output a signal corresponding to the difference signal of the first differential input signal pair and the difference signal of the second differential input signal pair.

The third input terminal may have an amount of voltage fluctuation occurred in accordance with voltage fluctuation of the first output node, the amount being equal to an amount of voltage fluctuation of the fourth input terminal occurred in accordance with voltage fluctuation of the second output node.

The first comparison circuit may include a first comparison unit configured to output, to the first output node and the second output node, a first differential output signal pair corresponding to the difference signal of the first differential input signal pair generated by connecting the first input terminal to the positive side and connecting the second input terminal to the negative side, and a second comparison unit configured to output, from the first output node and the second output node, a second differential output signal pair corresponding to the difference signal of the second differential input signal pair generated by connecting the third input terminal to the positive side and connecting the fourth input terminal to the negative side.

The second comparison circuit may include a third comparison unit configured to output, to a first internal node and a second internal node, a third differential output signal pair corresponding to the difference signal of the first differential input signal pair generated by connecting the second input terminal to the positive side and connecting the first input terminal to the negative side, and a fourth comparison unit configured to output, from the first internal node and the second internal node, a fourth differential output signal pair corresponding to the difference signal of the second differential input signal pair generated by connecting the third input terminal to the positive side and connecting the fourth input terminal to the negative side.

A first voltage setting circuit configured to set the first output node and the second output node to a predetermined voltage level within a period in which the first comparison circuit does not perform comparison operation, and a second voltage setting circuit configured to set the first internal node and the second internal node to a predetermined voltage level within a period in which the second comparison circuit does not perform comparison operation may further be included.

Each of the first comparison unit, the second comparison unit, the third comparison unit, and the fourth comparison unit may include an N-type transistor.

Each of the first voltage setting circuit and the second voltage setting circuit may include a P-type transistor.

Each of the first comparison unit, the second comparison unit, the third comparison unit, and the fourth comparison unit may include a P-type transistor, and each of the first voltage setting circuit and the second voltage setting circuit may include an N-type transistor.

The first comparison unit, the second comparison unit, the third comparison unit, and the fourth comparison unit may perform comparison operation when a predetermined signal is in a first logic and stop the comparison operation when the predetermined signal is in a second logic.

The first voltage setting circuit may set the first output node and the second output node to the predetermined voltage level when the predetermined signal is in the second logic.

The second voltage setting circuit may set the first internal node and the second internal node to the predetermined voltage level when the predetermined signal is in the second logic.

A latch circuit configured to hold the signal output from the first comparison circuit may further be included.

A waveform shaping circuit configured to perform waveform shaping on the signal output from the first comparison circuit may further be included. The latch circuit may hold a signal that is subjected to waveform shaping by the waveform shaping circuit.

The waveform shaping circuit may include an inverter.

A first latch circuit configured to hold the signal output from the first comparison circuit, and a second latch circuit configured to hold the signal output from the second comparison circuit may further be included.

According to the present disclosure, there is provided an analog-to-digital converter including:

a first sampling switch configured to switch whether or not to sample one signal of a differential input signal pair;

a first digital-to-analog converter configured to sequentially convert the sampled one signal into a digital signal including a plurality of bits, bit by bit, and output a signal having a voltage level in accordance with an unconverted bit;

a second sampling switch configured to switch whether or not to sample another signal of the differential input signal pair;

a second digital-to-analog converter configured to sequentially convert the another sampled signal into a digital signal including a plurality of bits, bit by bit, and output a signal having a voltage level in accordance with an unconverted bit;

a filter circuit configured to sample and output an output signal of the first digital-to-analog converter and an output signal of the second digital-to-analog converter;

a comparator configured to output a signal corresponding to a difference signal of a first differential input signal pair in which an output signal of the first digital-to-analog converter and an output signal of the second digital-to-analog converter form a pair and a difference signal of a second differential input signal pair output from the filter circuit; and a control circuit configured to control the first digital-to-analog converter and the second digital-to-analog converter on a basis of an output signal of the comparator.

The comparator includes a first input terminal and a second input terminal to which the first differential input signal pair is input, a third input terminal and a fourth input terminal to which the second differential input signal pair is input, a first comparison circuit configured to output a signal corresponding to a difference signal of the first differential input signal pair generated by connecting the first input terminal to a positive side and connecting the second input terminal to a negative side and a difference signal of the second differential input signal pair generated by connecting the third input terminal to a positive side and connecting the fourth input terminal to a negative side, and a second comparison circuit configured to output a signal corresponding to a difference signal of the first differential input signal pair generated by connecting the first input terminal to a negative side and connecting the second input terminal to a positive side, and a difference signal of the second differential input signal pair generated by connecting the third input terminal to a positive side and connecting the fourth input terminal to a negative side.

MODE FOR CARRYING OUT THE INVENTION

Hereinafter, embodiments of a comparator and an analog-to-digital converter will be described with reference to the drawings. The main components of the comparator and the analog-to-digital converter will be mainly described below, but the comparator and the analog-to-digital converter can have components and functions that are not illustrated or described. The following description does not exclude components and functions that are not illustrated or described.

First Embodiment

Figure 1:
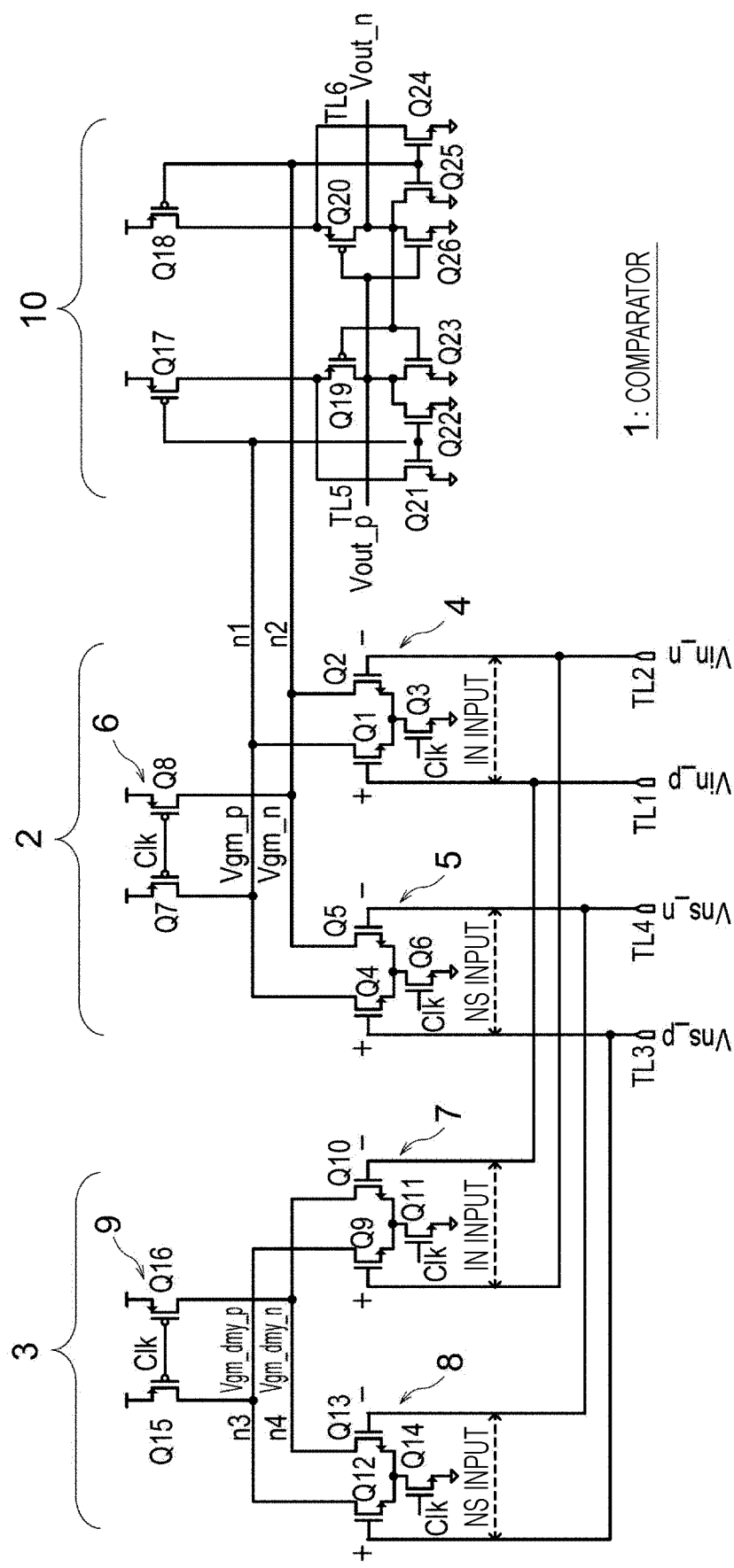
FIG. 1 is a circuit diagram of a comparator 1 according to a first embodiment.

FIG. 1 is a circuit diagram of a comparator 1 according to a first embodiment. The comparator 1 in FIG. 1 is used, for example, in a successive-approximation-register ADC as described later. However, the application of the comparator 1 in FIG. 1 is not necessarily limited to the ADC. Two differential input signal pairs (hereinafter, referred to as a first differential input signal pair and a second differential input signal pair) Vin_p and Vin_n, and Vns_p and Vns_n are input to the comparator 1 in FIG. 1. The comparator 1 outputs a differential output signal pair Vout_p and Vout_n corresponding to the difference signal of the first differential input signal pair Vin_p and Vin_n and the difference signal of the second differential input signal pair Vns_p and Vns_n. As described above, the comparator 1 in FIG. 1 is a dynamic comparator 1 that performs the comparison operation on the two differential input signal pairs Vin_p and Vin_n, and Vns_p and Vns_n.

The comparator 1 in FIG. 1 includes a first input terminal TL1 and a second input terminal TL2 to which the first differential input signal pair Vin_p and Vin_n is input, a third input terminal TL3 and a fourth input terminal TL4 to which the second differential input signal pair Vns_p and Vns_n are input, a first comparison circuit 2, and a second comparison circuit 3.

The first comparison circuit 2 outputs a signal corresponding to: the difference signal of the first differential input signal pair Vin_p and Vin_n generated by connecting the first input terminal TL1 to the positive side and connecting the second input terminal TL2 to the negative side; and the difference signal of the second differential input signal pair Vns_p and Vns_n generated by connecting the third input terminal TL3 to the positive side and connecting the fourth input terminal TL4 to the negative side.

The second comparison circuit 3 outputs a signal corresponding to: the difference signal of the first differential input signal pair Vin_p and Vin_n generated by connecting the first input terminal TL1 to the negative side and connecting the second input terminal TL2 to the positive side; and the difference signal of the second differential input signal pair Vns_p and Vns_n generated by connecting the third input terminal TL3 to the positive side and connecting the fourth input terminal TL4 to the negative side.

The first comparison circuit 2 and the second comparison circuit 3 have a common circuit configuration and common electrical characteristics. More specifically, the corresponding transistors in the first comparison circuit 2 and the second comparison circuit 3 have a common gate width and gate length.

The first comparison circuit 2 outputs, from a first output node n1 and a second output node n2, a first differential output signal pair corresponding to the difference signal of the first differential input signal pair Vin_p and Vin_n generated by connecting the first input terminal TL1 to the positive side and connecting the second input terminal TL2 to the negative side. The amount of the voltage fluctuation of the third input terminal TL3 generated in accordance with the voltage fluctuation of the first output node n1 is equal to the amount of the voltage fluctuation of the fourth input terminal TL4 generated in accordance with the voltage fluctuation of the second output node n2. On the other hand, the second comparison circuit 3 is not directly involved in the comparison operation of the comparator 1 and acts as a dummy circuit.

The first comparison circuit 2 includes a first comparison unit 4 and a second comparison unit 5.

The first comparison unit 4 outputs, from the first output node n1 and the second output node n2, the first differential output signal pair corresponding to the difference signal of the first differential input signal pair Vin_p and Vin_n generated by connecting the first input terminal TL1 to the positive side and connecting the second input terminal TL2 to the negative side.

The second comparison unit 5 outputs, from the first output node n1 and the second output node n2, a second differential output signal pair corresponding to the difference signal of the second differential input signal pair generated by connecting the third input terminal TL3 to the positive side and connecting the fourth input terminal TL4 to the negative side.

The first comparison unit 4 includes N-type MOS transistors Q1 and Q2. The first differential input signal Vin_p is input to the gate of the transistor Q1. The gate of the transistor Q1 is on the positive side. The first differential input signal Vin_n is input to the gate of the transistor Q2. The gate of the transistor Q2 is on the negative side.

An N-type MOS transistor Q3 is connected between the ground node and each source of the transistors Q1 and Q2. A clock signal Clk is input to the gate of the transistor Q3. The transistors Q1 and Q2 perform the comparison operation on the first differential input signal pair Vin_p and Vin_n when the clock signal Clk is at the high level, and stop the comparison operation when the clock signal Clk is at the low level. The drain of the transistor Q1 is connected to the first output node n1, and the drain of the transistor Q2 is connected to the second output node n2.

The second comparison unit 5 includes N-type MOS transistors Q4 and Q5. The first differential input signal Vns_p is input to the gate of the transistor Q4. The gate of the transistor Q4 is on the positive side. The second differential input signal Vns_n is input to the gate of the transistor Q5. The gate of the transistor Q5 is on the negative side.

An N-type MOS transistor Q6 is connected between the ground node and the sources of the transistors Q4 and Q5. The clock signal Clk is input to the gate of the transistor Q6. The transistors Q1 and Q2 perform the comparison operation on the first differential input signal pair Vin_p and Vin_n when the clock signal Clk is at the high level, and stop the comparison operation when the clock signal Clk is at the low level. The drains of the transistors Q4 and Q5 are respectively connected to the first output node n1 and the second output node n2.

A pull-up circuit (first voltage setting circuit) 6 is connected to the first output node n1 and the second output node n2. The pull-up circuit 6 pulls up the first output node n1 and the second output node n2 to the high level when the clock signal Clk is at the low level, that is, within a period in which the first comparison circuit 2 does not perform the comparison operation. The pull-up circuit 6 includes a P-type MOS transistor Q7 connected to the first output node n1 and a P-type MOS transistor Q8 connected to the second output node n2. The clock signal Clk is input to the gates of the transistors Q7 and Q8.

The second comparison circuit 3 includes a third comparison unit 7 and a fourth comparison unit 8.

The third comparison unit 7 outputs, from a first internal node n3 and a second internal node n4, a third differential output signal pair corresponding to the difference signal of the first differential input signal pair Vin_p and Vin_n generated by connecting the second input terminal TL2 to the positive side and connecting the first input terminal TL1 to the negative side.

The fourth comparison unit 8 outputs, from the first internal node n3 and the second internal node n4, a fourth differential output signal pair corresponding to the difference signal of the second differential input signal pair generated by connecting the third input terminal TL3 to the positive side and connecting the fourth input terminal TL4 to the negative side.

The third comparison unit 7 includes N-type MOS transistors Q9 and Q10. The first differential input signal Vin_n is input to the gate of the transistor Q9. The gate of the transistor Q9 is on the positive side. The first differential input signal Vin_p is input to the gate of the transistor Q10. The gate of the transistor Q10 is on the negative side.

An N-type MOS transistor Q11 is connected between the ground node and the sources of the transistors Q9 and Q10. The clock signal Clk is input to the gate of the transistor Q11. The transistors Q9 and Q10 perform the comparison operation on the first differential input signal pair Vin_p and Vin_n when the clock signal Clk is at the high level, and stop the comparison operation when the clock signal Clk is at the low level. The drain of the transistor Q9 is connected to the first internal node n3, and the drain of the transistor Q10 is connected to the second internal node n4.

The fourth comparison unit 8 includes N-type MOS transistors Q12 and Q13. The second differential input signal Vns_p is input to the gate of the transistor Q12. The gate of the transistor Q12 is on the positive side. The second differential input signal Vns_n is input to the gate of the transistor Q13. The gate of the transistor Q13 is on the negative side.

An N-type MOS transistor Q14 is connected between the ground node and the sources of the transistors Q12 and Q13. The clock signal Clk is input to the gate of the transistor Q14. The transistors Q12 and Q13 perform the comparison operation on the first differential input signal pair Vin_p and Vin_n when the clock signal Clk is at the high level, and stop the comparison operation when the clock signal Clk is at the low level. The drains of the transistors Q12 and Q13 are respectively connected to the first internal node n3 and the second internal node n4.

A pull-up circuit 9 (second voltage setting circuit) is connected to the first internal node n3 and the second internal node n4. The pull-up circuit 9 pulls up the first internal node n3 and the second internal node n4 to the high level when the clock signal Clk is at the low level. The pull-up circuit 9 includes a P-type MOS transistor Q15 connected to the first internal node n3 and a P-type MOS transistor Q16 connected to the second internal node n4. The clock signal Clk is input to the gates of the transistors Q15 and Q16.

The first internal node n3 and the second internal node n4 of the second comparison circuit 3 acting as a dummy circuit are not connected to any other than the dummy circuit. On the other hand, the first output node n1 and the second output node n2 of the first comparison circuit 2 are connected to a latch circuit 10. The latch circuit 10 holds the signal indicating the comparison result output from the first comparison circuit 2 at the timing when the clock signal Clk transitions from the high level to the low level.

The latch circuit 10 includes P-type MOS transistors Q17 to Q20 and N-type MOS transistors Q21 to Q26. The first output node n1 is connected to each gate of the transistors Q17, Q21, and Q22. The second output node n2 is connected to each gate of the transistors Q18, Q24, and Q25. Each gate of the transistors Q20 and Q26 and each drain of the transistors Q19 and Q23 are connected to the output terminal TL5 that outputs the differential output voltage Vout_p of the comparator 1. Each gate of the transistors Q19 and Q23 and each drain of the transistors Q25 and Q26 are connected to the output terminal TL6 that outputs the differential output voltage Vout_n of the comparator 1.

The comparator 1 in FIG. 1 starts the comparison operation when the clock signal Clk transitions from a low level to a high level. While the clock signal Clk is at the low level, the first output node n1 and the second output node n2 are pulled up to the power supply voltage level. When the clock signal Clk transitions to the high level, the transistors Q1, Q2, Q4, and Q5 are turned on, so that the first output node n1 and the second output node n2 decrease in voltage level. When Vin_p+Vns_p>Vin_n+Vns_n, the discharge speed of Vgm_p>the discharge speed of Vgm_n. Conversely, when Vin_p+Vns_p<Vin_n+Vns_n, the discharge speed of Vgm_p<the discharge speed of Vgm_n.

As described above, a difference is generated in the discharge speed between the first output node n1 and the second output node n2 in accordance with the input voltage Vin (=(Vin_p+Vns_p)−(Vin_n+Vns_n)) of the comparator 1.

Figure 2A:
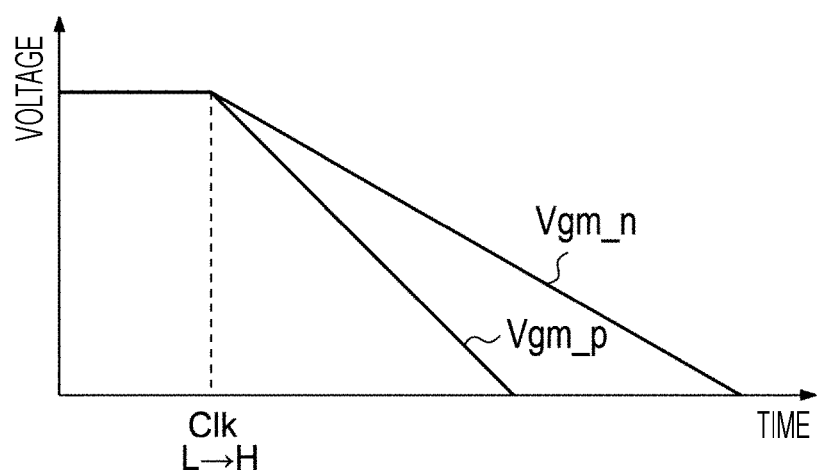
FIG. 2A is a waveform diagram of Vgm_p and Vgm_n during the comparison operation of the comparator 1.
Figure 2B:
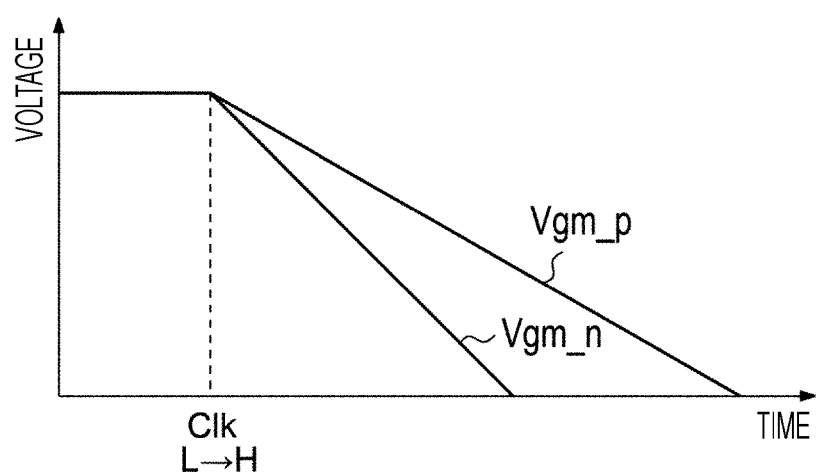
FIG. 2B is a waveform diagram when Vin_p+Vns_p<Vin_n+Vns_n.

FIG. 2A and FIG. 2B are waveform diagrams of Vgm_p and Vgm_n during the comparison operation of the comparator 1. FIG. 2A is a waveform diagram when Vin_p+Vns_p>Vin_n+Vns_n, and FIG. 2B is a waveform diagram when Vin_p+Vns_p<Vin_n+Vns_n.

The logic of the latch output of the latch circuit 10 on the subsequent-stage side of the comparator 1 is determined by the difference in discharge speed. If the discharge speed of Vgm_p>the discharge speed of Vgm_n, Vout_p=High/Vout_n=Low. If the discharge speed of Vgm_p<the discharge speed of Vgm_n, Vout_p=Low/Vout_n=High.

In the comparator 1 in FIG. 1, the signal Vin_p on the positive-phase side of the first differential input signal pair Vin_p and Vin_n is connected to the gate of the transistor Q1 on the positive-phase side of the first comparison unit 4 in the first comparison circuit 2 and is connected to the gate of the transistor Q10 on the negative-phase side of the third comparison unit 7 in the second comparison circuit 3. Furthermore, the signal Vin_n on the negative-phase side of the first differential input signal pair Vin_p and Vin_n is connected to the gate of the transistor Q2 on the negative-phase side of the first comparison unit 4 in the first comparison circuit 2 and is connected to the gate of the transistor Q9 on the positive-phase side of the fourth comparison unit 8 in the second comparison circuit 3. In this manner, the connection destinations of the first differential input signal pair Vin_p and Vin_n are reversed between the first comparison circuit 2 and the second comparison circuit 3.

The voltage levels of the first output node n1 and the second output node n2 from which the comparison result of the first comparison circuit 2 is output greatly fluctuate depending on the comparison result of the first comparison circuit 2. When the transistor Q1 or Q2 in FIG. 1 is turned on, the voltage level of the first output node n1 or the second output node n2 is lowered due to discharge. As described later, when the voltage level of the first output node n1 or the second output node n2 is lowered due to discharge, there is a possibility that a current flows through the gate of the transistor Q1 or Q2 via the parasitic capacitance of the MOS of the transistor Q1 or Q2 in the first comparison circuit 2, that is, a so-called kickback current is generated. When the kickback current flows through the gate, the gate voltage fluctuates, and the first comparison circuit 2 cannot output a normal comparison result. In FIG. 1, as a countermeasure against the kickback current, the connection destinations of the first differential input signal pair Vin_p and Vin_n are reversed between the first comparison circuit 2 and the second comparison circuit 3. With this configuration, the influence of the kickback current can be suppressed. The reason therefor will be described later.

Figure 3:
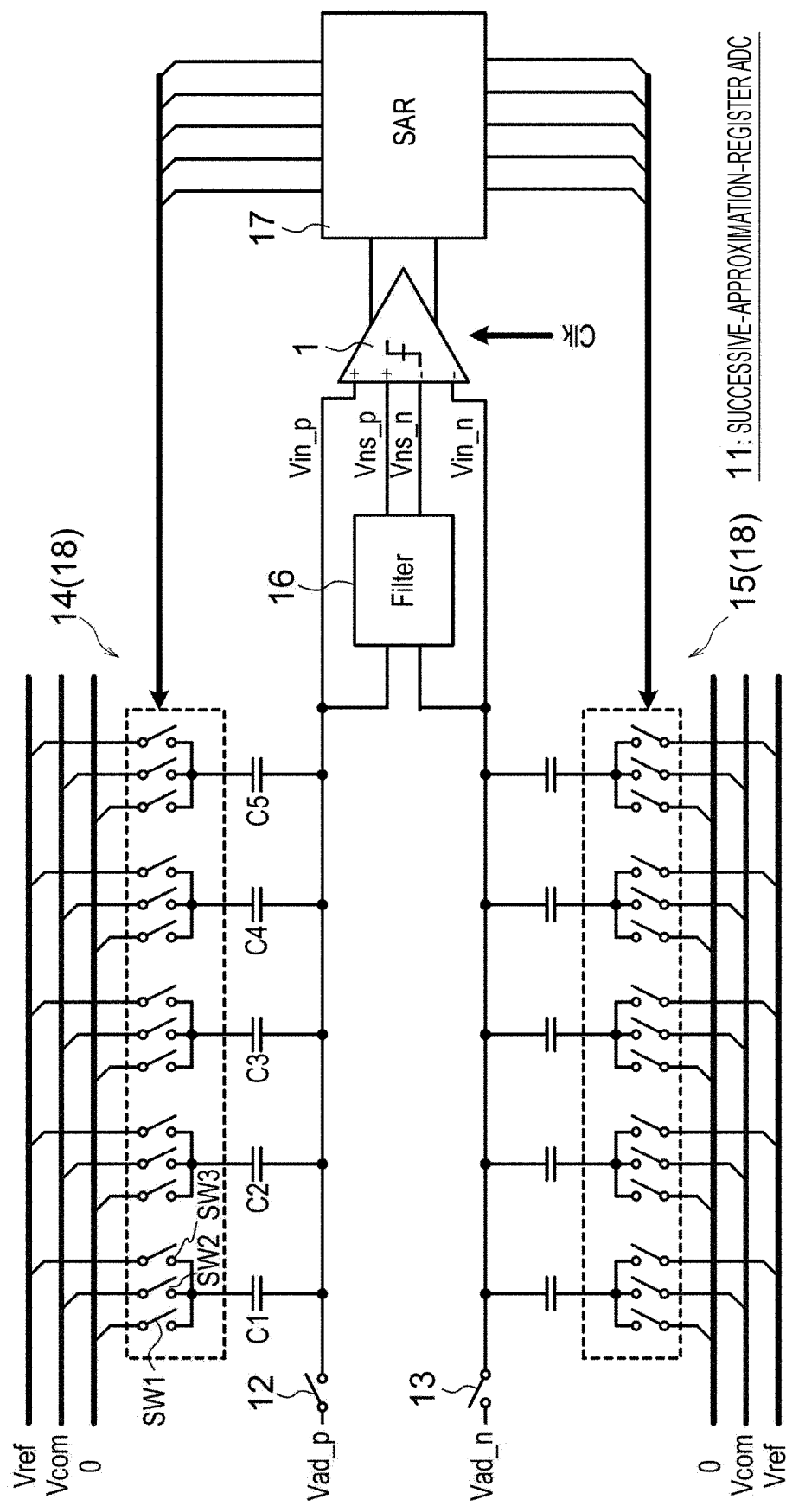
FIG. 3 is a circuit diagram of a successive-approximation-register ADC 11 including the comparator 1 in FIG. 1.

FIG. 3 is a circuit diagram of a successive-approximation-register ADC 11 including the comparator 1 in FIG. 1. FIG. 3 illustrates an example in which the successive-approximation-register ADC 11 converts a differential input signal pair into a 5-bit digital signal. Note that the bit depth of the successive-approximation-register ADC 11 may be any number. Furthermore, the circuit configuration of the successive-approximation-register ADC 11 is not limited to that illustrated in FIG. 3.

The successive-approximation-register ADC 11 in FIG. 3 includes a first sampling switch 12, a second sampling switch 13, a first digital-to-analog converter (hereinafter, the first DAC) 14, a second digital-to-analog converter (second DAC 15), a filter circuit 16, the comparator 1, and a control circuit (SAR logic) 17. In the present specification, the first DAC 14 and the second DAC 15 are collectively referred to as a capacitive DAC 18.

The first sampling switch 12 switches whether or not to sample one signal Vad_p of a differential input signal pair Vad_p and Vad_n. The second sampling switch 13 switches whether or not to sample the other signal Vad_n of the differential input signal pair Vad_p and Vad_n.

The first DAC 14 sequentially converts one sampled signal Vad_p into a digital signal including a plurality of bits, bit by bit, and outputs a signal having a voltage level in accordance with (an) unconverted bit(s).

The first DAC 14 includes five capacitors C1 to C5 having capacitances differing by a multiple of powers of 2, and three switches (first to third switches) SW1 to SW3 connected to each of the capacitors C1 to C5. The first switch SW1 switches whether or not to set one end of the capacitor to 0 V. The second switch SW2 switches whether or not to set one end of the capacitor to a common voltage Vcom. The third switch SW3 switches whether or not to set one end of the capacitor to a reference voltage Vref. The common voltage Vcom is, for example, at a voltage level of ½ of the reference voltage Vref.

The first to third switches SW1 to SW3 are switched on or off on the basis of a control signal from the control circuit 17. The control circuit 17 turns on the second switch SW2 at the time point of the start of the comparison operation. Thereafter, the control circuit 17 turns on the first switch SW1 in a case where it is desired to lower an output node voltage Vin_p of the first DAC 14, and turns on the third switch SW3 in a case where it is desired to raise the output node voltage Vin_p of the first DAC 14.

The second DAC 15 sequentially converts the other sampled signal into a digital signal including a plurality of bits, bit by bit, and outputs a signal having a voltage level in accordance with (an) unconverted bit(s). The second DAC 15 is configured similarly to the first DAC 14, and switches the first to third switches SW1 to SW3 on the basis of the control signal from the control circuit 17 similarly to the first DAC 14.

The filter circuit 16 samples and outputs the output signal of the first DAC 14 and the output signal of the second DAC 15.

The comparator 1 has the configuration illustrated in FIG. 1. The first differential input signal pair Vin_p and Vin_n in which the output signal of the first DAC 14 and the output signal of the second DAC 15 form a pair, and the second differential input signal pair Vns_p and Vns_n output from the filter circuit 16 are input to the comparator 1. The comparator 1 outputs a signal corresponding to the difference signal of the first differential input signal pair Vin_p and Vin_n and the difference signal of the second differential input signal pair Vns_p and Vns_n.

The control circuit 17 performs switching control on the first to third switches SW1 to SW3 in the first DAC 14 and the second DAC 15 on the basis of the output signal of the comparator 1.

Figure 4:
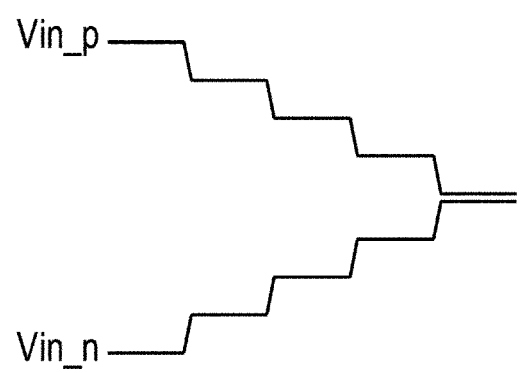
FIG. 4 is a voltage waveform diagram of an output node voltage Vin_p of a first DAC 14 and an output node voltage Vin_n of a second DAC 15 in FIG. 3.

FIG. 4 is a voltage waveform diagram of the output node voltage Vin_p of the first DAC 14 and an output node voltage Vin_n of the second DAC 15 in FIG. 3. First, both the first sampling switch 12 and the second sampling switch 13 are turned on to sample the differential input signal pair Vad_p and Vad_n. At this time, one end of each of the capacitors C1 to C5 is set to the common voltage Vcom via the second switch SW2. With this arrangement, electric charges in accordance with the difference signals of the differential input signal pair Vad_p and Vad_n are accumulated in the capacitive DAC 18. The output signal of the first DAC 14 and the output signal of the second DAC 15, both DAC constituting the capacitive DAC 18, are the first differential input signal pair Vin_p and Vin_n to be input to the comparator 1. Furthermore, the differential output signals of the filter circuit 16 are the second differential input signal pair Vns_p and Vns_n to be input to the comparator 1.

Thereafter, both the first sampling switch 12 and the second sampling switch 13 are turned off, and the comparison operation by the comparator 1 is started. The output of the capacitive DAC 18 is controlled such that the output voltage decreases in order from the bit described above in accordance with the difference signal of the sampled differential input signal pair Vad_p and Vad_n. The output voltage gradually approaches zero.

When the control is completed, the voltage remaining in the capacitive DAC 18 is sampled by the filter circuit 16 to change the output voltage of the filter circuit 16. Normally, the residual voltage at the time of completing the control of the capacitive DAC 18 is at a very small voltage level, and the filter circuit 16 continues to output a signal having a small voltage level. That is, the state of the difference signal $(V_{ns\_p}-V_{ns\_n}) \approx 0$ of the second differential input signal pair Vns_p and Vns_n is maintained. Therefore, in a case where the comparator 1 in FIG. 1 is used in the ADC 11 in FIG. 3, the difference between the discharge speeds of the voltage Vgm_p of the first output node n1 and the voltage Vgm_n of the second output node n2 in FIG. 1 is substantially determined only by the difference signal of the first differential input signal pair Vin_p and Vin_n.

As described above, in the comparator 1 in FIG. 1, when the voltage Vgm_p of the first output node n1 and the voltage Vgm_n of the second output node n2 are discharged, the kickback current flows through the gates of the transistors Q1 and Q2 in the first comparison unit 4 and the gates of the transistors Q4 and Q5 in the second comparison unit 5. The waveform of the kickback current greatly changes depending on the discharge speeds of the voltage Vgm_p of the first output node n1 and the voltage Vgm_n of the second output node n2.

In the ADC 11 in FIG. 3, the first differential input signal pair Vin_p and Vin_n to be input to the comparator 1 is connected to the output nodes of the capacitive DAC 18, and there is the plurality of capacitors C1 to C5 in the capacitive DAC 18. Therefore, even if a kickback current flows through the gates of the transistors Q1 and Q2 in the first comparison unit 4 in FIG. 1, the voltage fluctuation of the first differential input signal pair Vin_p and Vin_n is not large. On the other hand, there is no large capacitor for the output node of the filter circuit 16 to which the second differential input signal pair Vns_p and Vns_s is connected. Therefore, when a kickback current flows through the gates of the transistors Q4 and Q5 in the second comparison unit 5 in FIG. 1, there is a possibility that the voltage fluctuation of the second differential input signal pair Vns_p and Vns_s becomes relatively large due to the effect thereof.

As described above, the discharge of the differential output voltage pair Vgm_p and Vgm_n of the first and second output nodes n1 and n2 causes kickback to the second differential input signal pair Vns_p and Vns_n. If Vin_p=Vin_n, the discharge speeds of the differential output voltage pair Vgm_p and Vgm_n of the first and second output nodes n1 and n2 are the same, and the kickback current waveforms are also the same. Therefore, in a case where Vin_p=Vin_n, the voltage fluctuations of the second differential input signal pair Vns_p and Vns_n become the same, and the difference signal (Vns_p−Vns_n) of the second differential input signal pair Vns_p and Vns_n does not fluctuate. On the other hand, if Vin_p≠Vin_n, the discharge speeds are different, and the waveforms of kickback current to the second differential input signal pair Vns_p and Vns_n are also different. Therefore, it appears as a change in the difference signal (Vns_p−Vns_n) of the second differential input signal pair Vns_p and Vns_n. As the difference signal (Vin_p−Vin_n) of the first differential input signal pair Vin_p and Vin_n increases, the difference in discharge speed become increases; thus, the difference between the waveforms of the kickback currents to the second differential input signal pair Vns_p and Vns_n respectively increases, and the change in the difference signal (Vns_p−Vns_n) of the second differential input signal pair Vns_p and Vns_n increases.

As described above, the output signal level of the filter circuit 16 is originally a small voltage level. If there is a voltage fluctuation in the output signal level of the filter circuit 16 due to kickback, there is a possibility that a desired operation as the ADC 11 is not performed, and the characteristics of the ADC 11 themselves are deteriorated. Furthermore, if the output impedance of the filter circuit 16 is lowered in order to reduce the voltage fluctuation, the design of the filter circuit 16 itself becomes difficult due to an increase in current consumption and the like.

As described above, the connection destinations of the first differential input signal pair Vin_p and Vin_n are reversed between the first comparison circuit 2 and the second comparison circuit 3 in the comparator 1 in FIG. 1. With this configuration, the amount of voltage fluctuation due to the kickback of one signal Vns_p of the second differential input signal pair Vns_p and Vns_n and the amount of voltage fluctuation due to the kickback of the other signal Vns_n of the second differential input signal pair Vns_p and Vns_n can be made equal. Thus, the amount of voltage fluctuation due to the kickback of each gate of the transistors Q4 and Q5 in the second comparison unit 5 can be offset. This will be described in more detail.

In the comparator 1 in FIG. 1, it is assumed that the kickback current from the voltage Vgm_p of the first output node n1 to the second differential input signal Vns_p is Iα and the kickback current from the voltage Vgm_n of the second output node n2 to the second differential input signal Vns_n is Iβ. The difference between the kickback currents of the second differential input signal pair Vns_p and Vns_n in a case where the second comparison circuit 3 serving as a dummy circuit does not exist is Iα−Iβ.

The discharge speed of a second internal node n4 voltage Vgm_dmy_n in the second comparison circuit 3 serving as a dummy circuit is the same as the discharge speed of a first internal node n3 voltage Vgm_dmy_p. Thus, the kickback current from the second internal node n4 voltage Vgm_dmy_n to the second differential input signal Vns_n is Iα. Similarly, the kickback current from the first internal node n3 voltage Vgm_dmy_p to the second differential input signal Vns_p is Iβ. When the first comparison circuit 2 and the second comparison circuit 3 are considered together, the kickback current to the second differential input signal Vns_p is Iα+Iβ, and the kickback current to the second differential input signal Vns_n is Iα+Iβ. Therefore, the difference between the kickback currents of the second differential input signals Vns_p and Vns_n is (Iα+Iβ)−(Iα+Iβ)=0. The fact that the difference between the kickback currents is zero means that there is no fluctuation due to the kickback of the second differential input signals Vns_p and Vns_n of the comparator 1.

As described above, in the comparator 1 in FIG. 1, the connection destinations of the signals on the positive-phase side and on the negative-phase side of the first differential input signal pair Vin_p and Vin_n are reversed each other between the first comparison unit 4 in the first comparison circuit 2 and the third comparison unit 7 in the second comparison circuit 3. Thus, even if the kickback current flows through the gates of the transistors Q4 and Q5 in the second comparison unit 5 due to the discharge of the first output node n1 and the second output node n2, the kickback currents flowing through the gates of the transistors Q4 and Q5 can be equalized. Therefore, the amount of voltage fluctuation due to the kickback current are offset from each other, and the first output node n1 and the second output node n2 are not affected by the kickback current.

Figure 5:
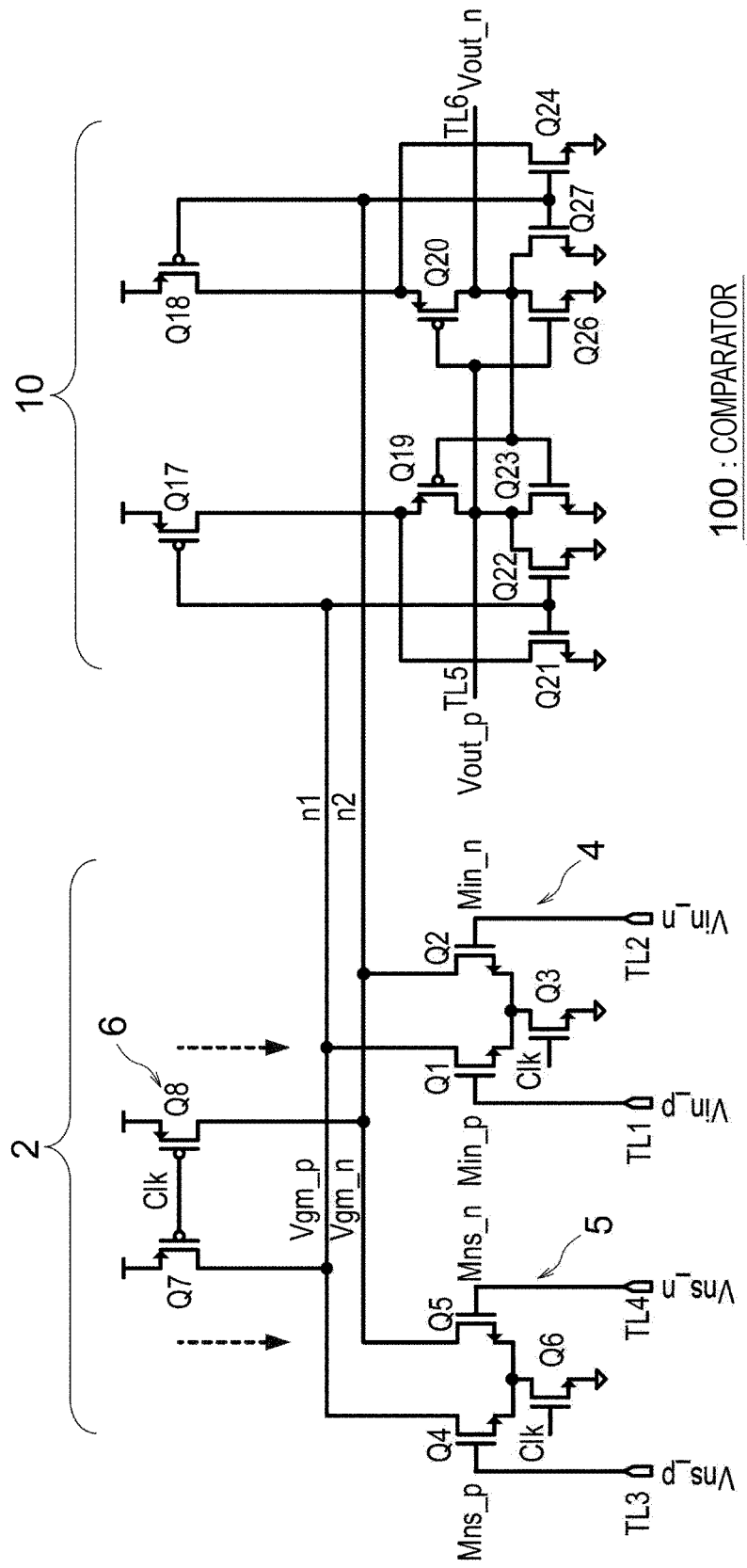
FIG. 5 is a circuit diagram of a comparator 100 according to a comparative example.

FIG. 5 is a circuit diagram of a comparator 100 according to a comparative example. The comparator 100 in FIG. 5 includes the first comparison circuit 2 and the latch circuit 10 in FIG. 1, but does not include the second comparison circuit 3. In the comparator 100 in FIG. 1, it is assumed that the kickback current from the voltage Vgm_p of the first output node n1 to the second differential input signal Vns_p is Iα and the kickback current from the voltage Vgm_n of the second output node n2 to the second differential input signal Vns_n is Iβ. Since the second comparison circuit 3 serving as a dummy circuit does not exist, the difference in kickback current between the gates of the transistors Q4 and Q5 in the second comparison unit 5 is Iα−Iβ and not zero. Therefore, in the comparator 100 in FIG. 5, when the voltage level of the voltage Vgm_p of the first output node n1 and the voltage Vgm_n of the second output node n2 fluctuates depending on the discharge speed, a difference (Iα−Iβ) in kickback current according to the amount of the fluctuation is generated. Thus, the differential output voltages Vgm_p and Vgm_n of the comparator 100 fluctuate in accordance with the difference.

Figure 6A:
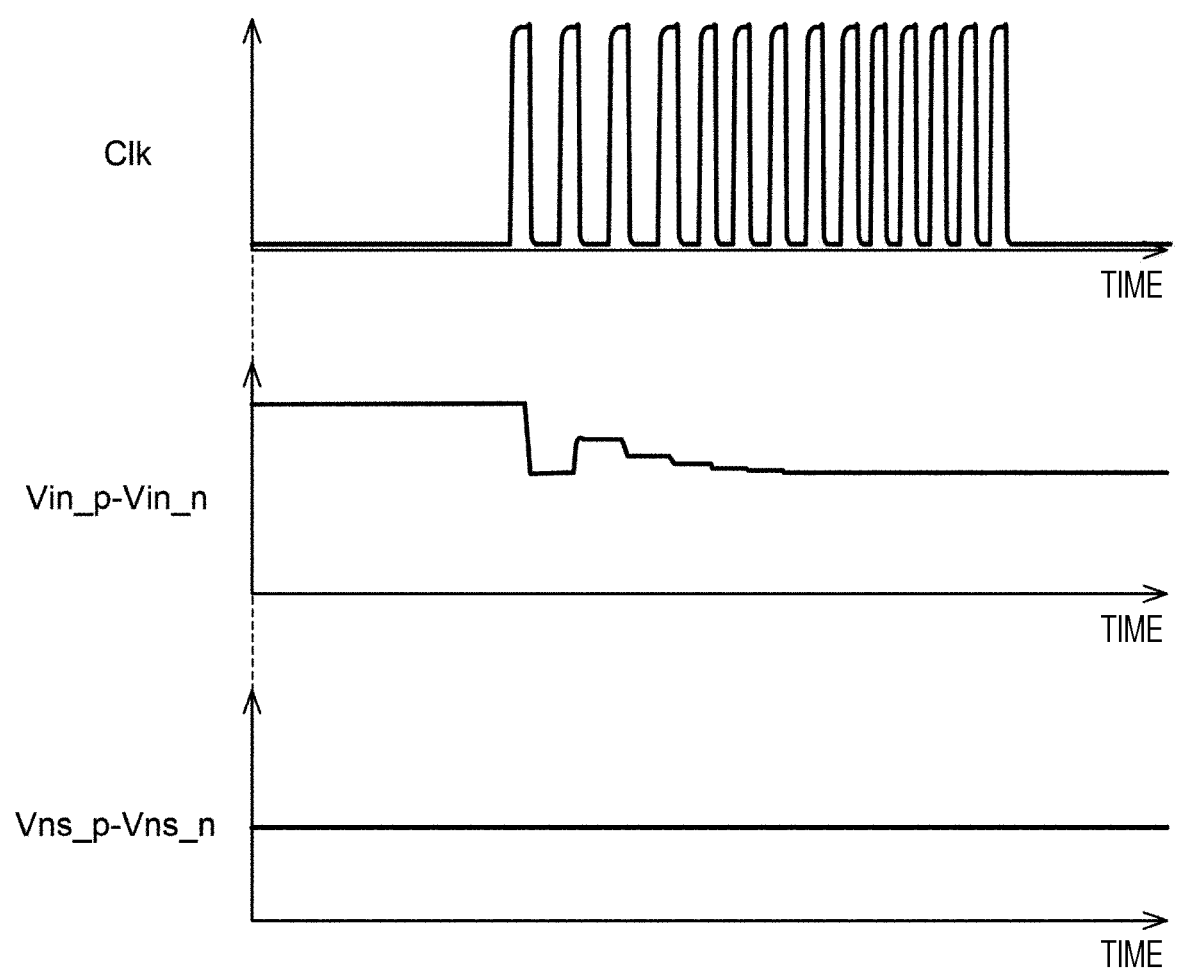
FIG. 6A is a signal waveform diagram of each unit in the comparator 1 in FIG. 1 by simulation.
Figure 6B:
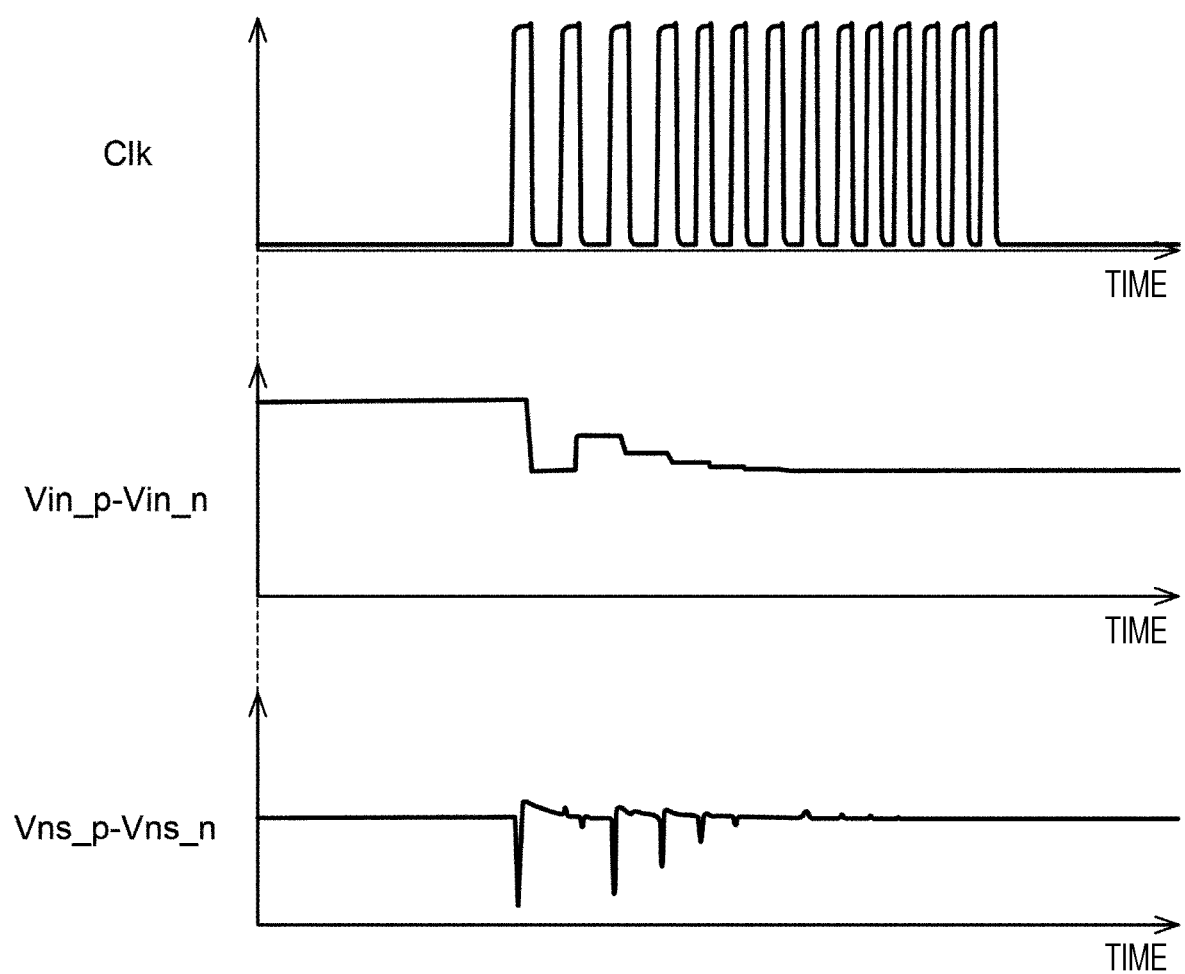
FIG. 6B is a signal waveform diagram of each unit in the comparator 100 in FIG. 5 by simulation.

FIG. 6A is a signal waveform diagram of each unit in the comparator 1 in FIG. 1 by simulation. FIG. 6B is a signal waveform diagram of each unit in the comparator 100 in FIG. 5 by simulation. FIGS. 6A and 6B illustrate a voltage waveform of the clock signal Clk, a voltage waveform of the difference signal (Vin_p–Vin_n) of the first differential input signal pair Vin_p and Vin_n, and a voltage waveform of the difference signal (Vns_p–Vns_n) of the second differential input signal pair Vns_p and Vns_n.

In FIGS. 6A and 6B, the comparators 1 and 100 start the comparison operation at time t1. The control circuit 17 sequentially determines the charged electric charge of the capacitors of the capacitive DAC 18 from the higher order side such that the output voltage (Vin_p–Vin_n) of the capacitive DAC 18 is zero. The output signal (Vns_p–Vns_n) of the filter circuit 16 is substantially 0 V in FIG. 6A, whereas in FIG. 6B, a voltage fluctuation in a large spike shape is caused every time the comparator 100 performs the comparison operation. More specifically, in the simulation result in FIG. 6A, the output voltage of the filter circuit 16 is a minute DC voltage of about 300 μV, whereas in FIG. 6B, a voltage fluctuation in a very large spike shape occurs, and may exceed 1 mV at the maximum.

As the voltage of the output voltage Vin_p–Vin_n of the capacitive DAC 18 increases, the difference in the discharge speed between the voltage Vgm_p of the first output node n1 and the voltage Vgm_n of the second output node n2 increases, and the voltage fluctuation of Vns_p–Vns_n due to the kickback current increases.

On the other hand, in a case where the voltage of the output voltage Vin_p–Vin_n of the capacitive DAC 18 is small, the difference in the discharge speed between the voltage Vgm_p of the first output node n1 and the voltage Vgm_n of the second output node n2 is small, and the voltage fluctuation of Vns_p–Vns_n due to the kickback current hardly appears.

In a case of the successive-approximation-register ADC 11 using the noise shaping technique, the output voltage of the filter circuit 16 is desirably kept to be a constant voltage while the comparison operation is being performed. When the output voltage of the filter circuit 16 fluctuates, there is a possibility that the analog-to-digital conversion operation cannot be normally performed, and the characteristics of the ADC 11 themselves are deteriorated.

In the voltage waveform of the output voltage Vin_p–Vin_n of the capacitive DAC 18 in FIG. 6A, which is the simulation result of the comparator 1 in FIG. 1, no voltage fluctuation in a spike shape is observed. It can be seen that the output voltage of the filter circuit 16 can stably hold a DC voltage of about 200 μV during the comparison operation. Therefore, the performance of the ADC 11 can be improved by using the comparator 1 in FIG. 1 for the ADC 11 in FIGS. 2A and 2B.

As described above, separately from the first comparison circuit 2 to which the first differential input signal pair Vin_p and Vin_n and the second differential input signal pair Vns_p and Vns_n are input, the comparator 1 according to the first embodiment is provided with the second comparison circuit 3 serving as a dummy circuit and having the same circuit configuration and the same electrical characteristics as the first comparison circuit 2. Between the first comparison circuit 2 and the second comparison circuit 3, connection destinations of the first differential input signal pair Vin_p and Vin_n are reversed from each other. More specifically, in the first comparison unit 4 in the first comparison circuit 2, the positive-phase side signal of the first differential input signal pair Vin_p and Vin_n is input to the gate of the positive-phase side transistor, whereas in the third comparison unit 7 in the second comparison circuit 3, the positive-phase side signal of the first differential input signal pair Vin_p and Vin_n is input to the gate of the negative-phase side transistor. With this arrangement, even if the kickback current flows through the gates of the transistors Q4 and Q5 in the second comparison unit 5 due to the voltage fluctuation of the voltages Vgm_p and Vgm_n of the first output node n1 and the second output node n2 of the first comparison circuit 2, the amount of voltage fluctuation due to the kickback current at the gates of the transistors Q4 and Q5 can be equalized. Therefore, in the Vgm_p and Vgm_n of the first output node n1 and the second output node n2, voltage fluctuation due to the kickback current does not occur. Thus, the output voltage of the comparator 1 can be stabilized, and the performance deterioration of the ADC 11 can be suppressed.

Second Embodiment

In the comparator 1 in FIG. 1, the first comparison unit 4 and the second comparison unit 5 in the first comparison circuit 2 and the third comparison unit 7 and the fourth comparison unit 8 in the second comparison circuit 3 include N-type MOS transistors, but may include P-type MOS transistors.

Figure 7:
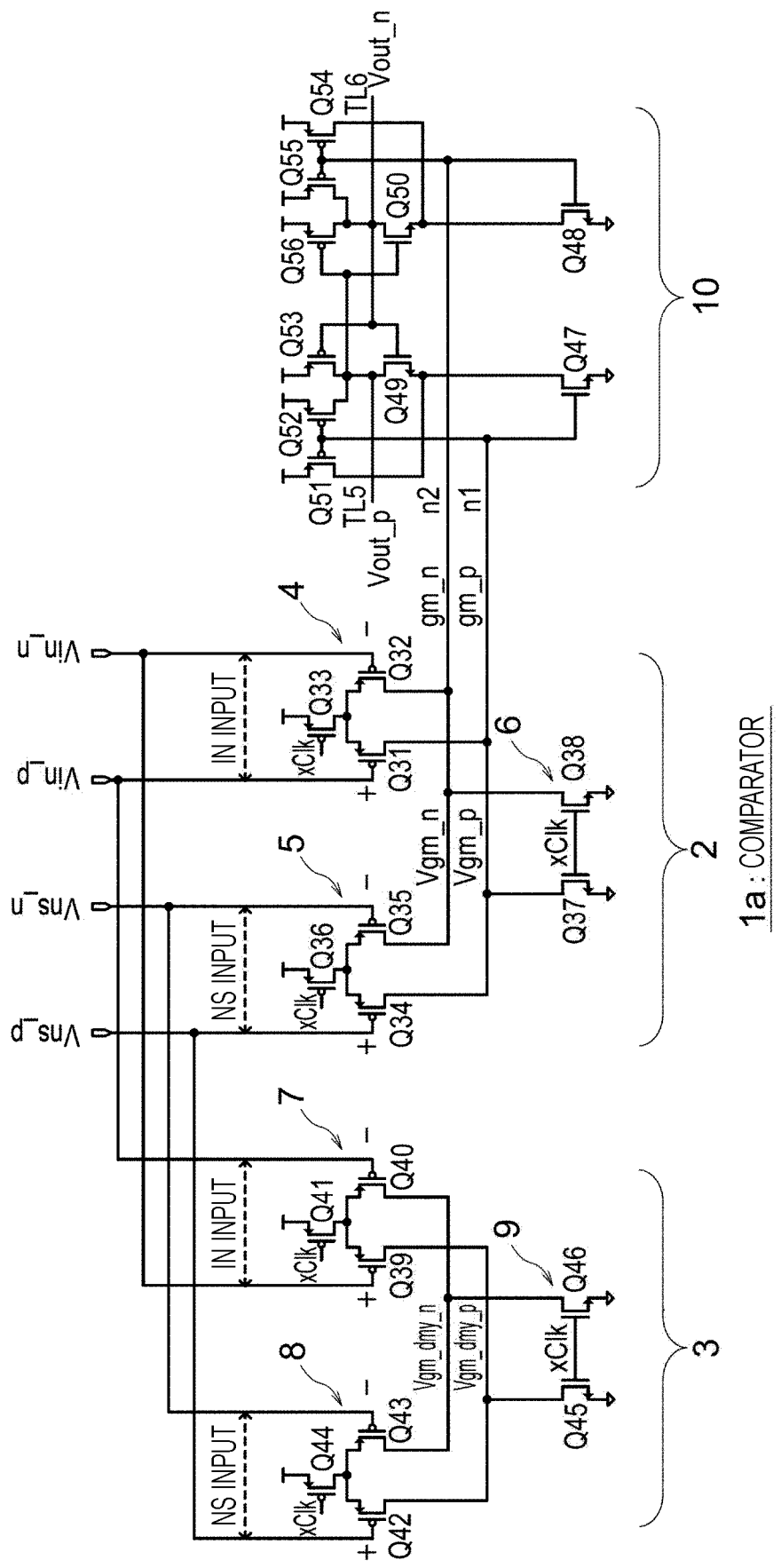
FIG. 7 is a circuit diagram of a comparator 1a according to a second embodiment.

FIG. 7 is a circuit diagram of a comparator 1a according to a second embodiment. The comparator 1a in FIG. 7 is a comparator in which the conductivity type of each transistor in the comparator 1 in FIG. 1 is reversed, and includes transistors Q31 to Q38, Q41 to Q46, and Q51 to Q56. For example, a first comparison unit 4 and a second comparison unit 5 in a first comparison circuit 2 in the comparator 1a in FIG. 7 include P-type MOS transistors Q31 to Q36. This applies to a third comparison unit 7 and a fourth comparison unit 8 in a second comparison circuit 3 in a similar manner. Furthermore, a pull-up circuit 6 includes N-type MOS transistors Q37 and Q38. Moreover, the conductivity type of each of the transistors Q51 to Q56 in a latch circuit 10 is also opposite to that of the latch circuit in FIG. 1.

In the comparator 1a in FIG. 7, the connection order of each transistor connected between the power supply node and the ground node is opposite to that of the comparator 1 in FIG. 1, but the operation principle is the same.

In the comparator 1a in FIG. 7, the connection destinations of the positive-side signal and the negative-side signal of a first differential input signal pair Vin_p and Vin_n are opposite to each other between the first comparison unit 4 in the first comparison circuit 2 and the third comparison unit 7 in the second comparison circuit 3, similarly to the comparator 1 in FIG. 1. Therefore, also in the comparator 1a in FIG. 7, even if the kickback current flows through the gates of transistors Q4 and Q5 in the second comparison unit 5 due to the voltage fluctuation of voltages Vgm_p and Vgm_n of a first output node n1 and a second output node n2, the voltage fluctuation due to the kickback current do not occur in the voltages Vgm_p and Vgm_n, and the performance deterioration of an ADC 11 can be suppressed, similarly to the comparator 1 in FIG. 1.

Third Embodiment

A third embodiment is different from the first embodiment in the configuration of a latch circuit 10.

Figure 8:
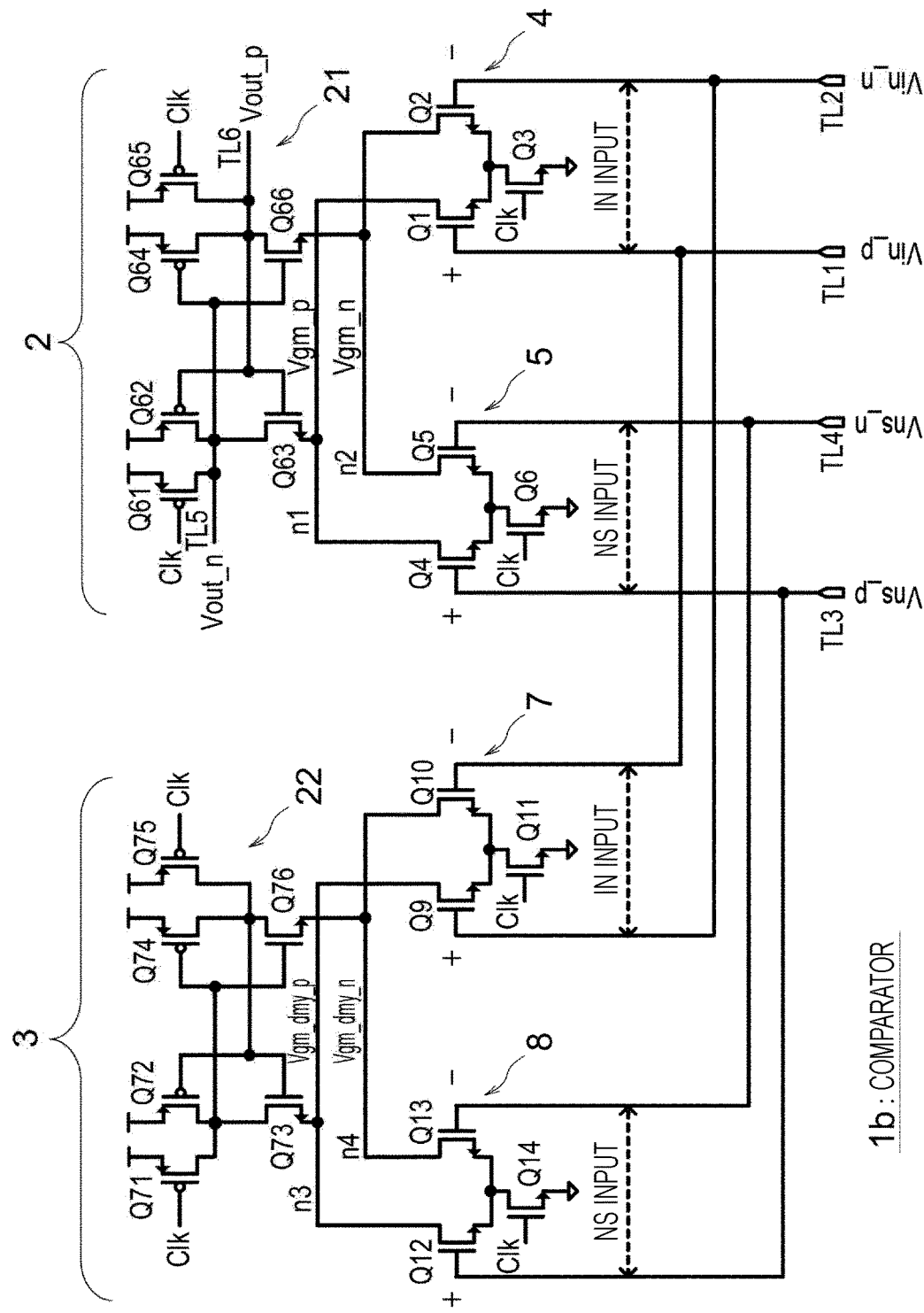
FIG. 8 is a circuit diagram of a comparator 1b according to a third embodiment.

FIG. 8 is a circuit diagram of a comparator 1b according to the third embodiment. The comparator 1b in FIG. 8 includes a first comparison circuit 2 and a second comparison circuit 3 having the circuit configurations similar to those of the comparator 1 in FIG. 1. The comparator 1b in FIG. 8 includes a first latch circuit 21 connected to a first output node n1 and a second output node n2 of the first comparison circuit 2, and a second latch circuit 22 connected to a first internal node n3 and a second internal node n4 of the second comparison circuit 3.

The first latch circuit 21 includes P-type MOS transistors Q61 to Q64 and N-type MOS transistors Q65 and Q66. A clock signal Clk is input to each gate of the transistors Q61 and Q63. The gates of the transistors Q62 and Q65 and each drain of the transistors Q63 and Q64 are connected to an output node voltage Vout_p. Each gate of the transistors Q64 and Q66 and the drains of the transistors Q62 and Q65 are connected to an output node voltage Vout_n. The source of the transistor Q65 is connected to a voltage Vgm_p of the first output node n1, and the source of the transistor Q66 is connected to a voltage Vgm_n of the second output node n2.

The second latch circuit 22 includes P-type MOS transistors Q71 to Q74 and N-type MOS transistors Q75 and Q76, and is configured similarly to the first latch circuit 21.

When the clock signal Clk transitions from a low level to a high level, the comparator 1b in FIG. 8 starts the comparison operation. Thereafter, at a stage in which the clock signal Clk transitions from the high level to the low level, the first latch circuit 21 holds the comparison result obtained by the first comparison circuit 2, and the second latch circuit 22 holds the comparison result by the second comparison circuit 3.

In the comparator 1b in FIG. 8, the connection destinations of the positive-side signal and the negative-side signal of a first differential input signal pair Vin_p and Vin_n are opposite to each other in a first comparison unit 4 in the first comparison circuit 2 and a third comparison unit 7 in the second comparison circuit 3, similarly to the comparator 1 in FIG. 1. Therefore, also in the comparator 1b in FIG. 8, even if the kickback current flows through the gates of transistors Q4 and Q5 in the second comparison unit 5 due to the voltage fluctuation of the voltages Vgm_p and Vgm_n of the first output node n1 and the second output node n2, the voltage fluctuation due to the kickback current does not occur in the voltages Vgm_p and Vgm_n, and the performance deterioration of an ADC 11 can be suppressed, similarly to the comparator 1 in FIG. 1.

Note that the conductivity type of each transistor in the comparator 1b in FIG. 8 may be reversed similarly to the comparator 1a in FIG. 7.

Fourth Embodiment

A comparator 1c according to a fourth embodiment inputs the signal output from a first comparison circuit 2 to a latch circuit 10 after performing waveform shaping thereon.

Figure 9:
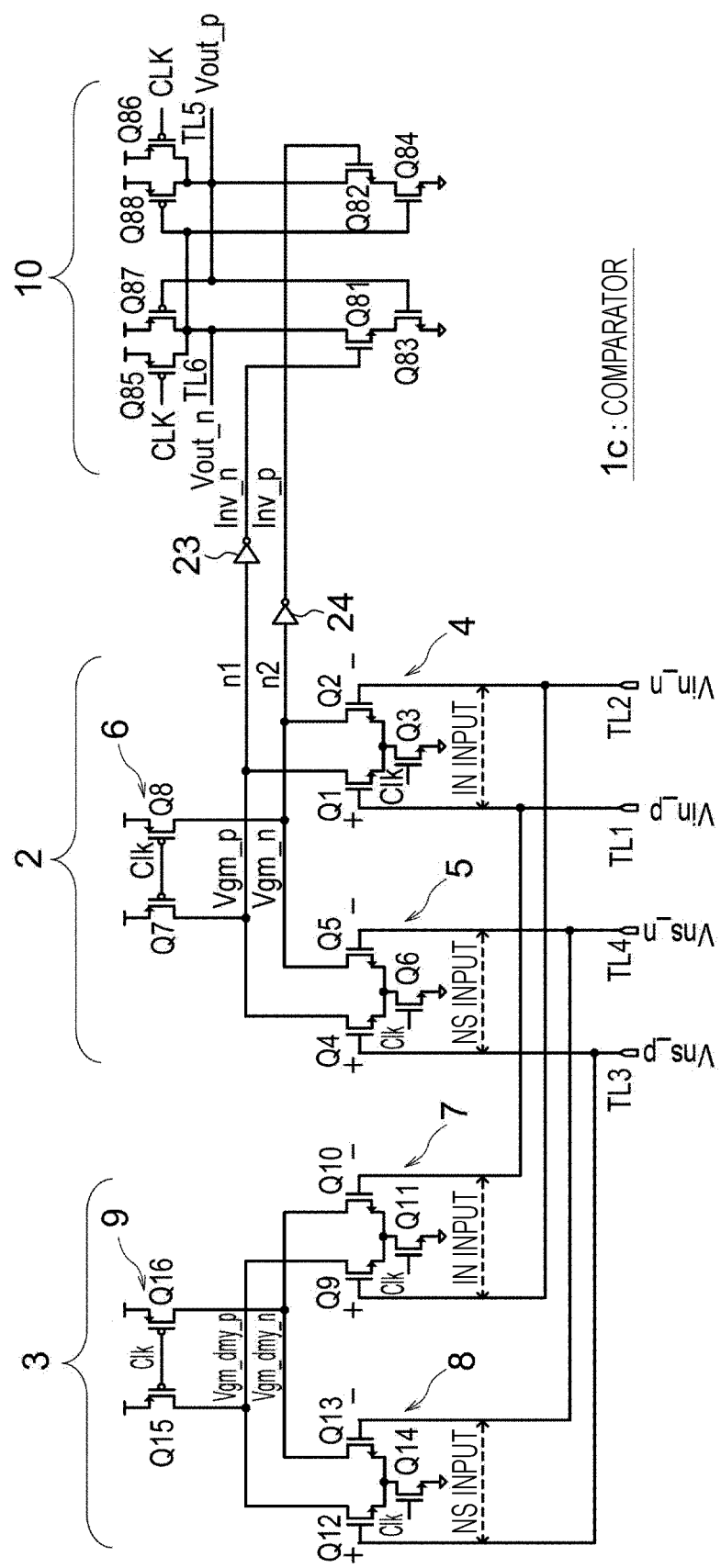
FIG. 9 is a circuit diagram of a comparator 1c according to a fourth embodiment.

FIG. 9 is a circuit diagram of the comparator 1c according to the fourth embodiment. The comparator 1c in FIG. 9 includes a first comparison circuit 2, a second comparison circuit 3, and the latch circuit 10 having the configurations similar to those of the comparator 1 in FIG. 1. In addition to this, the comparator 1c in FIG. 9 includes inverters 23 and 24. The inverters 23 and 24 are respectively connected to a first output node n1 and a second output node n2 connected to the first comparison circuit 2.

The inverters 23 and 24 invert and output the logic of the input signal, and at that time, perform waveform shaping to make the output signal waveform steep. In this manner, the inverters 23 and 24 act as a waveform shaping circuit. Various logical operation elements (for example, a NAND element, a NOR element, or the like) may be used instead of the inverters 23 and 24.

The voltage levels of voltages Vgm_p and Vgm_n of the first output node n1 and the second output node n2 decrease due to discharge by transistors Q1, Q2, Q4, and Q5 in a first comparison unit 4 and a second comparison unit 5. The inverters 23 and 24 are charged along with the discharge of the voltages Vgm_p and Vgm_n of the first output node n1 and the second output node n2. The latch circuit 10 performs a holding operation by logic according to a charge speed difference between the output voltages of the inverters 23 and 24.

In the comparator 1c in FIG. 9, the connection destinations of the positive-side signal and the negative-side signal of a first differential input signal pair Vin_p and Vin_n are opposite to each other in the first comparison unit 4 in the first comparison circuit 2 and a third comparison unit 7 in the second comparison circuit 3, similarly to the comparator 1 in FIG. 1. Therefore, also in the comparator 1b in FIG. 8, even if the kickback current flows through the gates of transistors Q4 and Q5 in the second comparison unit 5 due to the voltage fluctuation of the voltages Vgm_p and Vgm_n of the first output node n1 and the second output node n2, the voltage fluctuation due to the kickback current does not occur in the voltages Vgm_p and Vgm_n, and the performance deterioration of an ADC 11 can be suppressed, similarly to the comparator 1 in FIG. 1.

Note that the waveform shaping circuit by the inverters 23 and 24 and the like in FIG. 9 may be provided in the comparator 1a or 1b in FIG. 7 or FIG. 8.

As described above, in the fourth embodiment, the latch circuit 10 performs the holding operation after the output signal of the first comparison circuit 2 is once subjected to waveform shaping by the inverters 23 and 24 and the like. Thus, the latch circuit 10 can quickly perform the holding operation, and the operation speed of the comparator 1c in FIG. 9 can be improved.

A technical feature common to the comparators 1, 1a, 1b, and 1c according to the first to fourth embodiments described above is that the second comparison circuit 3 having the same circuit configuration and the same electrical characteristics as those of the first comparison circuit 2 is provided, and in the first comparison circuit 2 and the second comparison circuit 3, the connection destinations of the first differential input signal pair Vin_p and Vin_n are reversed. With this technical feature, fluctuations in the voltages Vgm_p and Vgm_n of the first output node n1 and the second output node n2 of the first comparison circuit 2 due to the kickback current can be suppressed.

Note that the present technology can have the following configurations.

(1) There is provided a comparator including:
  a first input terminal and a second input terminal to which a first differential input signal pair is input;
  a third input terminal and a fourth input terminal to which a second differential input signal pair is input;
  a first comparison circuit configured to output a signal corresponding to a difference signal of the first differential input signal pair generated by connecting the first input terminal to a positive side and connecting the second input terminal to a negative side and a difference signal of the second differential input signal pair generated by connecting the third input terminal to a positive side and connecting the fourth input terminal to a negative side; and a second comparison circuit configured to output a signal corresponding to a difference signal of the first differential input signal pair generated by connecting the first input terminal to a negative side and connecting the second input terminal to a positive side, and a difference signal of the second differential input signal pair generated by connecting the third input terminal to a positive side and connecting the fourth input terminal to a negative side.

(2) The comparator according to (1), further including a first output terminal and a second output terminal configured to output a differential output signal pair corresponding to the signal output from the first comparison circuit.

(3) The comparator according to (1) or (2), in which the difference signal of the first differential input signal pair has a voltage level larger than a voltage level of the difference signal of the second differential input signal pair.

(4) The comparator according to any one of (1) to (3), in which the first comparison circuit and the second comparison circuit have a common circuit configuration and common electrical characteristics.

(5) The comparator according to any one of (1) to (4), in which
the first comparison circuit includes a first output node and a second output node configured to differentially output a signal corresponding to the difference signal of the first differential input signal pair and the difference signal of the second differential input signal pair, and
the third input terminal has an amount of voltage fluctuation occurred in accordance with voltage fluctuation of the first output node, the amount being equal to an amount of voltage fluctuation of the fourth input terminal occurred in accordance with voltage fluctuation of the second output node.

(6) The comparator according to (5), in which
the first comparison circuit includes
a first comparison unit configured to output, to the first output node and the second output node, a first differential output signal pair corresponding to the difference signal of the first differential input signal pair generated by connecting the first input terminal to the positive side and connecting the second input terminal to the negative side, and
a second comparison unit configured to output, from the first output node and the second output node, a second differential output signal pair corresponding to the difference signal of the second differential input signal pair generated by connecting the third input terminal to the positive side and connecting the fourth input terminal to the negative side, and
the second comparison circuit includes
a third comparison unit configured to output, to a first internal node and a second internal node, a third differential output signal pair corresponding to the difference signal of the first differential input signal pair generated by connecting the second input terminal to the positive side and connecting the first input terminal to the negative side, and
a fourth comparison unit configured to output, from the first internal node and the second internal node, a fourth differential output signal pair corresponding to the difference signal of the second differential input signal pair generated by connecting the third input terminal to the positive side and connecting the fourth input terminal to the negative side.

(7) The comparator according to (6), further including:
a first voltage setting circuit configured to set the first output node and the second output node to a predetermined voltage level within a period in which the first comparison circuit does not perform comparison operation; and
a second voltage setting circuit configured to set the first internal node and the second internal node to a predetermined voltage level within a period in which the second comparison circuit does not perform comparison operation.

(8) The comparator according to (7), in which
each of the first comparison unit, the second comparison unit, the third comparison unit, and the fourth comparison unit includes an N-type transistor, and
each of the first voltage setting circuit and the second voltage setting circuit includes a P-type transistor.

(9) The comparator according to (7), in which
each of the first comparison unit, the second comparison unit, the third comparison unit, and the fourth comparison unit includes a P-type transistor, and
each of the first voltage setting circuit and the second voltage setting circuit includes an N-type transistor.

(10) The comparator according to any one of (7) to (9), in which
the first comparison unit, the second comparison unit, the third comparison unit, and the fourth comparison unit perform comparison operation when a predetermined signal is in a first logic and stop the comparison operation when the predetermined signal is in a second logic,
the first voltage setting circuit sets the first output node and the second output node to the predetermined voltage level when the predetermined signal is in the second logic, and
the second voltage setting circuit sets the first internal node and the second internal node to the predetermined voltage level when the predetermined signal is in the second logic.

(11) The comparator according to any one) of (1) to (10), further including a latch circuit configured to hold the signal output from the first comparison circuit.

(12) The comparator according to (11), further including a waveform shaping circuit configured to perform waveform shaping on the signal output from the first comparison circuit, in which the latch circuit holds a signal that is subjected to waveform shaping by the waveform shaping circuit.

(13) The comparator according to (12), in which the waveform shaping circuit includes an inverter.

(14) The comparator according to any one) of (1) to (10), further including:
a first latch circuit configured to hold the signal output from the first comparison circuit; and
a second latch circuit configured to hold the signal output from the second comparison circuit.

(15) An analog-to-digital converter including:
a first sampling switch configured to switch whether or not to sample one signal of a differential input signal pair;
a first digital-to-analog converter configured to sequentially convert the sampled one signal into a digital signal including a plurality of bits, bit by bit, and output a signal having a voltage level in accordance with an unconverted bit;
a second sampling switch configured to switch whether or not to sample another signal of the differential input signal pair;

a second digital-to-analog converter configured to sequentially convert the another sampled signal into a digital signal including a plurality of bits, bit by bit, and output a signal having a voltage level in accordance with an unconverted bit;
a filter circuit configured to sample and output an output signal of the first digital-to-analog converter and an output signal of the second digital-to-analog converter;
a comparator configured to output a signal corresponding to a difference signal of a first differential input signal pair in which an output signal of the first digital-to-analog converter and an output signal of the second digital-to-analog converter form a pair and a difference signal of a second differential input signal pair output from the filter circuit; and
a control circuit configured to control the first digital-to-analog converter and the second digital-to-analog converter on a basis of an output signal of the comparator,
in which the comparator includes
a first input terminal and a second input terminal to which the first differential input signal pair is input,
a third input terminal and a fourth input terminal to which the second differential input signal pair is input,
a first comparison circuit configured to output a signal corresponding to a difference signal of the first differential input signal pair generated by connecting the first input terminal to a positive side and connecting the second input terminal to a negative side and a difference signal of the second differential input signal pair generated by connecting the third input terminal to a positive side and connecting the fourth input terminal to a negative side, and
a second comparison circuit configured to output a signal corresponding to a difference signal of the first differential input signal pair generated by connecting the first input terminal to a negative side and connecting the second input terminal to a positive side, and a difference signal of the second differential input signal pair generated by connecting the third input terminal to a positive side and connecting the fourth input terminal to a negative side.

Aspects of the present disclosure are not limited to the above-described individual embodiments, but include various modifications that can be conceived by those skilled in the art. The effects of the present disclosure are also not limited to the above-described contents. That is, various additions, alterations, and partial deletions can be made without departing from the conceptual idea and spirit of the present disclosure derived from the contents defined in the claims and equivalents thereof.

REFERENCE SIGNS LIST 1, 1a, 1b, 1c Comparator
2 First comparison circuit
3 Second comparison circuit
4 First comparison unit
Second comparison unit
6 Pull-up circuit
7 Third comparison unit
8 Fourth comparison unit
9 Pull-up circuit
Latch circuit
11 ADC
12 First sampling switch
13 Second sampling switch
14 First DAC
Second DAC
16 Filter circuit
17 Control circuit
18 Capacitive DAC
21 First latch circuit
22 Second latch circuit

The invention claimed is:

1. A comparator, comprising:
a first input terminal and a second input terminal configured to receive a first differential input signal pair;
a third input terminal and a fourth input terminal configured to receive a second differential input signal pair;
a first comparison circuit configured to output a first signal corresponding to:
a difference signal of the first differential input signal pair based on connection of the first input terminal to a positive side and connection of the second input terminal to a negative side, and
a difference signal of the second differential input signal pair based on connection of the third input terminal to the positive side and connection of the fourth input terminal to the negative side; and
a second comparison circuit configured to output a second signal corresponding to:
a difference signal of the first differential input signal pair based on connection of the first input terminal to the negative side and connection of the second input terminal to the positive side, and
a difference signal of the second differential input signal pair based on connection of the third input terminal to the positive side and connection of the fourth input terminal to the negative side.

2. The comparator according to claim 1, further comprising a first output terminal and a second output terminal configured to output a differential output signal pair corresponding to the first signal output from the first comparison circuit.

3. The comparator according to claim 1, wherein the difference signal of the first differential input signal pair has a voltage level larger than a voltage level of the difference signal of the second differential input signal pair.

4. The comparator according to claim 1, wherein the first comparison circuit and the second comparison circuit have a common circuit configuration and common electrical characteristics.

5. The comparator according to claim 1, wherein
the first comparison circuit includes a first output node and a second output node configured to differentially output a third signal corresponding to the difference signal of the first differential input signal pair and the difference signal of the second differential input signal pair,
the third input terminal has an amount of voltage fluctuation based on voltage fluctuation of the first output node,
the amount of voltage fluctuation of the third input terminal is equal to an amount of voltage fluctuation of the fourth input terminal, and
the amount of voltage fluctuation of the fourth input terminal is based on voltage fluctuation of the second output node.

6. The comparator according to claim 5, wherein
the first comparison circuit includes:
a first comparison unit configured to output, to the first output node and the second output node, a first differential output signal pair corresponding to the difference signal of the first differential input signal pair based on connection of the first input terminal to the positive side and connection of the second input terminal to the negative side, and a second comparison unit configured to output, from the first output node and the second output node, a second differential output signal pair corresponding to the difference signal of the second differential input signal pair based on connection of the third input terminal to the positive side and connection of the fourth input terminal to the negative side, and the second comparison circuit includes:
a third comparison unit configured to output, to a first internal node and a second internal node, a third differential output signal pair corresponding to the difference signal of the first differential input signal pair based on connection of the second input terminal to the positive side and connection of the first input terminal to the negative side, and a fourth comparison unit configured to output, from the first internal node and the second internal node, a fourth differential output signal pair corresponding to the difference signal of the second differential input signal pair based on connection of the third input terminal to the positive side and connection of the fourth input terminal to the negative side.

7. The comparator according to claim 6, further comprising:
a first voltage setting circuit configured to set the first output node and the second output node to a first voltage level within a period in which the first comparison circuit does not perform comparison operation; and
a second voltage setting circuit configured to set the first internal node and the second internal node to a second voltage level within a period in which the second comparison circuit does not perform comparison operation.

8. The comparator according to claim 7, wherein
each of the first comparison unit, the second comparison unit, the third comparison unit, and the fourth comparison unit includes an N-type transistor, and
each of the first voltage setting circuit and the second voltage setting circuit includes a P-type transistor.

9. The comparator according to claim 7, wherein
each of the first comparison unit, the second comparison unit, the third comparison unit, and the fourth comparison unit includes a P-type transistor, and
each of the first voltage setting circuit and the second voltage setting circuit includes an N-type transistor.

10. The comparator according to claim 7, wherein
each of the first comparison unit, the second comparison unit, the third comparison unit, and the fourth comparison unit configured to:
perform comparison operation based on determination that a specific signal is in a first logic, and
stop the comparison operation based on determination that the specific signal is in a second logic,
the first voltage setting circuit is further configured to set the first output node and the second output node to the first voltage level based on determination that the specific signal is in the second logic, and
the second voltage setting circuit sets the first internal node and the second internal node to the second voltage level based on determination that the specific signal is in the second logic.

11. The comparator according to claim 1, further comprising a latch circuit configured to hold the first signal output from the first comparison circuit.

12. The comparator according to claim 11, further comprising a waveform shaping circuit configured to perform a waveform shaping process on the first signal output from the first comparison circuit,
wherein the latch circuit is further configured to hold the first signal that is subjected to the waveform shaping process by the waveform shaping circuit.

13. The comparator according to claim 12, wherein the waveform shaping circuit includes an inverter.

14. The comparator according to claim 1, further comprising:
a first latch circuit configured to hold the first signal output from the first comparison circuit; and
a second latch circuit configured to hold the second signal output from the second comparison circuit.

15. An analog-to-digital converter, comprising:
a first sampling switch configured to switch whether or not to sample one signal of a differential input signal pair;
a first digital-to-analog converter configured to:
sequentially convert, bit by bit, the sampled one signal to a digital signal including a plurality of bits, and
output a first signal that includes a voltage level based on an unconverted bit of the sampled one signal;
a second sampling switch configured to switch whether or not to sample the other signal of the differential input signal pair;
a second digital-to-analog converter configured to:
sequentially convert, bit by bit, the sampled other signal into a digital signal including a plurality of bits, and
output a second signal that includes a voltage level based on an unconverted bit of the sampled other signal;
a filter circuit configured to sample and output an output signal of the first digital-to-analog converter and an output signal of the second digital-to-analog converter;
a comparator configured to output a specific signal corresponding to:
a difference signal of a first differential input signal pair in which the output signal of the first digital-to-analog converter and the output signal of the second digital-to-analog converter form a pair, and
a difference signal of a second differential input signal pair output from the filter circuit; and
a control circuit configured to control the first digital-to-analog converter and the second digital-to-analog converter based on an output signal of the comparator,
wherein the comparator includes:
a first input terminal and a second input terminal configured to receive the first differential input signal pair,
a third input terminal and a fourth input terminal configured to receive the second differential input signal pair,
a first comparison circuit configured to output a third signal corresponding to:
a difference signal of the first differential input signal pair based on connection of the first input terminal to a positive side and connection of the second input terminal to a negative side, and
a difference signal of the second differential input signal pair based on connection of the third input terminal to the positive side and connection of the fourth input terminal to the negative side, and a second comparison circuit configured to output a fourth signal corresponding to:
  a difference signal of the first differential input signal pair based on connection of the first input terminal to the negative side and connection of the second input terminal to the positive side, and
  a difference signal of the second differential input signal pair based on connection of the third input terminal to the positive side and connection of the fourth input terminal to the negative side.

\* \* \* \* \*